United States Patent [19]

Vora

[11] Patent Number: 4,543,595
[45] Date of Patent: Sep. 24, 1985

[54] BIPOLAR MEMORY CELL

[75] Inventor: Madhukar B. Vora, Los Gatos, Calif.

[73] Assignee: Fairchild Camera and Instrument Corporation, Mountain View, Calif.

[21] Appl. No.: 380,184

[22] Filed: May 20, 1982

[51] Int. Cl.[4] .................. H01L 29/70; H01L 27/04; H01L 23/52

[52] U.S. Cl. ........................................ 357/71; 357/15; 357/59; 357/92; 357/67; 357/86; 365/154; 365/175; 365/189; 365/190; 307/272 R; 307/291; 307/317 A

[58] Field of Search ............... 357/15, 59, 92, 675, 357/71 S, 71 P, 86; 365/154, 175, 190, 189; 307/272 R, 291, 317 A

[56] References Cited

U.S. PATENT DOCUMENTS

| 3,573,499 | 4/1971 | Lynes | 365/154 |
|---|---|---|---|
| 3,770,606 | 11/1973 | Lepselter | 357/15 |
| 3,922,565 | 11/1975 | Berger et al. | 357/15 |
| 4,104,732 | 8/1978 | Hewlett, Jr. | 307/317 A |
| 4,220,961 | 9/1980 | Werner | 357/15 |
| 4,412,239 | 10/1983 | Iwasaki et al. | 357/92 |
| 4,450,470 | 5/1984 | Shiba | 357/86 |

Primary Examiner—William D. Larkins
Assistant Examiner—Charles S. Small, Jr.
Attorney, Agent, or Firm—Carl L. Silverman; David H. Carroll; Robert C. Colwell

[57] ABSTRACT

A bipolar memory cell is fabricated by forming diodes 60 and 65 on top of the transistors Q1 and Q2 formed in the underlying substrate 10. Metal silicide 30 overlies strips 34 and 35 of doped polycrystalline silicon 25, 28, 37, and 38 to cross-couple the bases and collectors of the two transistors Q1 and Q2 forming the memory cell. The metal silicide 30 shorts PN junctions 29 in polycrystalline 23. Two further strips 50 and 52, each comprising a sandwich of P type polycrystalline silicon 42, metal silicide 45, and N conductivity type polycrystalline silicon 47, are formed to couple the cross-coupled bases and collectors to respective diodes 60 and 65. The diodes 60 and 65 are formed by depositing metal 62 and 64 in electrical contact with the underlying N type polycrystalline silicon 47.

17 Claims, 12 Drawing Figures

BIPOLAR MEMORY CELL

BACKGROUND OF THE INVENTION

1. Field of the Invention

This invention relates to integrated circuits, and in particular to a method of fabricating a compact bipolar memory cell and the resulting structure.

2. Description of the Prior Art

Several types of integrated bipolar transistor memory cells are known. In such structures the transistors which comprise the flip flop of the memory cell are electrically connected together by metal and/or polycrystalline silicon electrodes. A typical prior art structure is shown in "1024 BIT ECL RAM with 15 ns Access Time," by R. Rathbone et al., *International Solid State Circuits Conference* 1976, pages 188–89. All such prior art structures, however, have typically occupied an undesirably large area of the semiconductor material in which they are fabricated because of the difficulty of compactly interconnecting the transistors and providing associated load elements, usually other transistors or diodes, without consuming additional surface area of the semiconductor material.

Bit line powered bipolar memory cells are also known. For example, William Herndon in U.S. Pat. No. 4,032,902 entitled "Semiconductor Memory Cell Circuit and Structure" teaches fabrication of a bit line powered bipolar memory cell having four transistors. Jan Lohstroh, in "Static Bipolar RAM Cell with Compact Punch-Through Loads," *Digest of Technical Papers*, 1979 *IEEE International Solid-State Circuits Conference*, pages 14–15, teaches fabrication of a static bipolar memory cell having non-linear load devices. The Lohstroh circuit, however, uses punch-through diodes, and requires an unusual power supply. It also occupies an undesirably large area of semiconductor material.

SUMMARY OF THE INVENTION

This invention provides an extremely compact bit line powered bipolar memory cell in which diodes are used as load devices. The structure provides exceptional performance utilizing a relatively small number of masking steps and generally noncritical alignment steps. With one micron dimension features, over a million memory cells may be fabricated on a 56,000 square mil chip.

In one embodiment, an integrated circuit memory cell fabricated according to this invention comprises: a first transistor and a second transistor each formed in a semiconductor substrate and each including a base, a collector, and an emitter; first and second connections of semiconductor material each extending between the base of one of the first and second transistors and the collector of the other of the first and second transistors, regions of the first and second connections being doped to correspond to the conductivity type of the base or the collector contacted; first and second layers of electrically conductive material deposited on the first and second connections, respectively, to short any PN junctions therein; first and second regions of semiconductor material deposited on the substrate to contact the collector of the first and second transistors, respectively; third and fourth layers of electrically conductive material deposited on the first and second regions of semiconductor material, respectively; third and fourth regions of semiconductor material deposited upon the third and fourth layers of electrically conductive material, respectively; and fifth and sixth regions of electrically conductive material deposited in contact with selected portions of the third and fourth regions of semiconductor material, respectively, to thereby form Schottky diodes.

In the preferred embodiment the first and second transistors comprise vertical bipolar transistors, while the first and second connections comprise strips of polycrystalline silicon doped to correspond to the conductivity type of the regions of the first and second transistors contacted. Also in the preferred embodiment, the layers of electrically conductive material are refractory metal silicide, while the regions of semiconductor material are polycrystalline silicon.

In another embodiment a method of connecting two opposite conductivity type regions in an underlying integrated circuit substrate and providing diodes connected thereto comprises depositing a first layer of semiconductor material, doping the first layer of semiconductor material to match the underlying regions to be connected, depositing a first electrically conductive layer on the first layer of semiconductor material to short any PN junctions therein, forming insulating material over the first electrically conductive layer, depositing a second layer of semiconductor material over the insulating material and on the underlying integrated circuit structure, depositing a second layer of electrically conductive material on the second layer of semiconductive material, depositing a third layer of semiconductive material on the second electrically conductive layer, and depositing a metal in contact with selected portions of the third layer of semiconductor material to thereby form Schottky diodes. In the preferred embodiment the second layer of semiconductor material is P conductivity type polycrystalline silicon, and the third layer of semiconductor material is in N conductivity type polycrystalline silicon. The metal is typically aluminum and the insulating material typically silicon dioxide.

Furthermore, in the preferred embodiment, the first layer of semiconductor material and the first electrically conductive layer are patterned into two parallel strips, while the second and third layers of semiconductor material and the second electrically conductive layer are patterned into two other strips disposed generally perpendicular to the strips defined by the first layer of semiconductor material.

DESCRIPTION OF THE PREFERRED EMBODIMENTS

Figure 1:
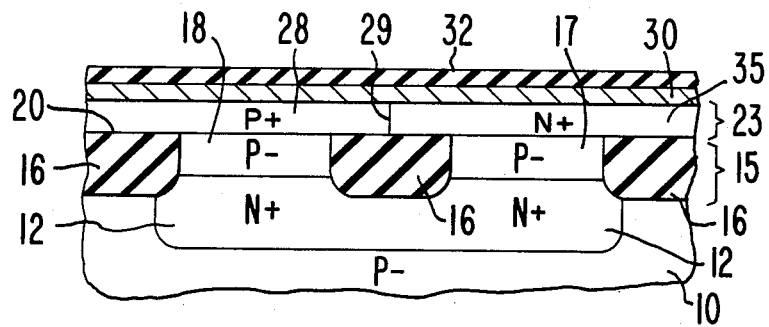
FIG. 1 is a cross-sectional view of an integrated circuit structure which may be fabricated utilizing known process steps.

FIG. 1 is a cross-sectional view of a semiconductor structure including a P conductivity type silicon substrate 10, N conductivity type buried layer 12, and an intrinsic epitaxial silicon layer 15 divided into two electrically isolated pockets 17 and 18 by silicon dioxide insulating region 16. In the preferred embodiment of this invention substrate 10 will comprise monocrystalline silicon having a resistivity of 2 ohm-centimeters, while buried layer 12 will be doped with an N conductivity type impurity, for example, antimony, to a concentration of approximately $10^{19}$ atoms per cubic centimeter. The buried layer 12, epitaxial layer 15, and silicon dioxide insulating region 16 may be fabricated using well-known techniques, for example, as taught by Douglas Peltzer in U.S. Pat. No. 3,648,125 entitled, "Method of Fabricating Integrated Circuits with Oxidized Isolation and the Resulting Structure." During that process epitaxial layer 15 is lightly doped with a suitable P conductivity type impurity, for example, boron, to a concentration of about $5 \times 10^{16}$ atoms per cubic centimeter. As will be explained, lightly doped P region 17 will function as the base for a subsequently formed NPN transistor, while region 18 will function as the connection to the base of another NPN transistor fabricated nearby in epitaxial layer 15. Layer 15 may be doped most readily by implanting boron ions using a dose of $10^{13}$ atoms per square centimeter and an implant energy of 150 kev.

As also shown in FIG. 1 on the upper surface 20 of the structure just discussed, a layer of polycrystalline silicon 23 approximately 5000 Angstroms thick is deposited, for example, by using chemical vapor deposition. Using known techniques, polycrystalline silicon layer 23 is then masked and N and P conductivity type impurities are introduced to form the regions shown in FIG. 1. In the preferred embodiment the N type portion 25 of layer 23 will be doped with a concentration of approximately $10^{20}$ atoms per cubic centimeter of arsenic, while the P type portion 28 of layer 23 will be doped with a concentration of approximately $10^{19}$ atoms per cubic centimeter of boron. Depending upon the masking techniques employed, a PN junction 29 may be formed in layer 23, although as will be explained any PN junction will be shorted by subsequent process operations.

At the same time that regions 25 and 28 are doped with P and N conductivity type impurities, other portions of layer 23 behind the cross-section shown in FIG. 1 are also doped with appropriate conductivity type impurities. The doping of these other regions in layer 23 is more clearly shown in FIG. 3.

On the upper surface of polycrystalline silicon layer 23, a layer of a metal silicide 30 is deposited. In the preferred embodiment silicide layer 30 comprises a refractory metal silicide, for example, tantalum silicide or tungsten silicide which is approximately 1000 Angstroms thick and fabricated by chemical vapor deposition. The use of a refractory metal silicide to fabricate layer 30 is preferred because of the excellent ohmic connections thereby formed between each of regions 25 and 28 and layer 30, and because of the resistance of refractory metal silicides to subsequent high temperature processing.

On the upper surface of metal silicide 30 a layer of silicon dioxide 32 approximately 3000 Angstroms thick is formed. This may be most readily accomplished by heating the underlying structure, including silicide 30, to a temperature of about 800° C. for three hours in a steam ambient. The silicide layer 30 will ohmically connect region 18 to region 17, shorting any PN junction 29 between these regions.

Figure 2:
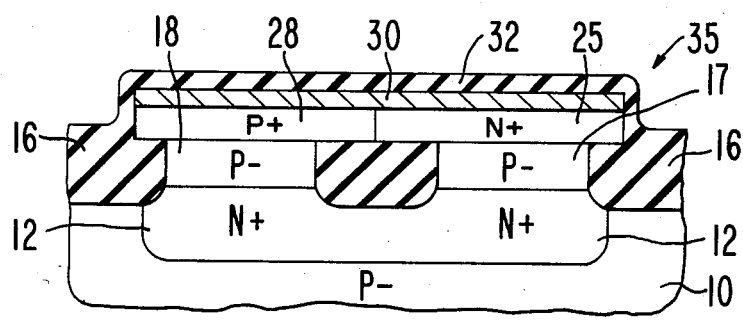
FIG. 2 is a subsequent cross-sectional view after definition of a first layer of semiconductor material and a first electrically conductive layer.
Figure 3:
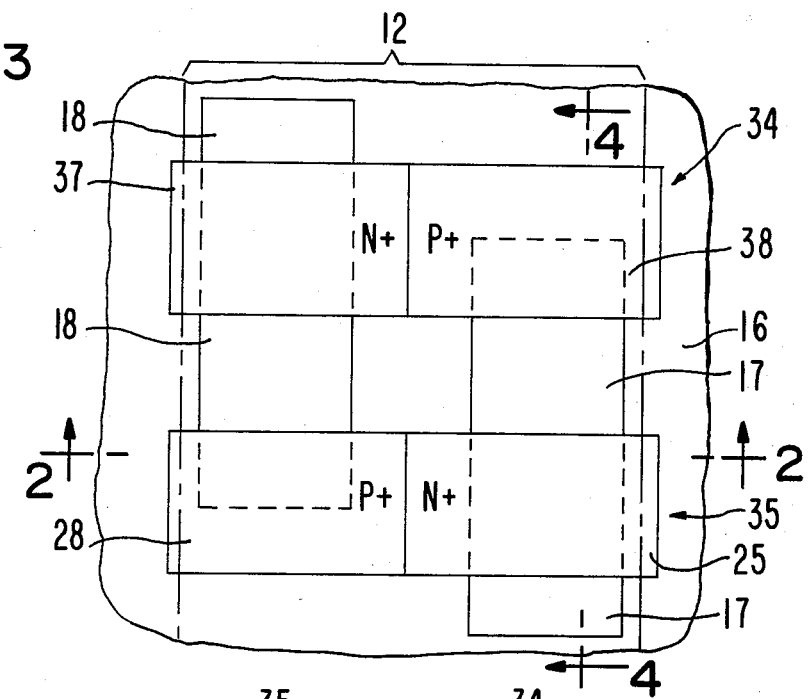
FIG. 3 is a top view of the structure shown in FIG. 2.

Using well-known semiconductor fabrication techniques, the structure depicted in FIG. 1 is then masked and etched, using appropriate chemical or plasma etching techniques, to define two strips 34 and 35 each comprising a portion of polycrystalline silicon layer 23 together with overlying metal silicide 30. Only strip 35 is shown in FIG. 2, while both strips 34 and 35 are shown in FIG. 3. In the preferred embodiment masks are formed using known photolithographic techniques, and the strips are defined by etching the structure with a plasma which comprises carbon tetrafluoride to etch oxide layer 32 and carbon tetrachloride to etch metal silicide 30 and polycrystalline silicon 23. The conductivity types of regions 37 and 38 in strip 34 are reversed from the conductivity types of regions 28 and 25 in strip 35. The existence of, or location of, any PN junction created between regions 28 and 37, and between regions 25 and 38, is not significant because this PN junction is removed during the definition of strips 34 and 35. Of course, if desired, only those portions of layer 23 which are to remain after definition of strips 34 and 35 need to be doped, while the other portions of layer 23 which are later removed may be left undoped.

Figure 4:
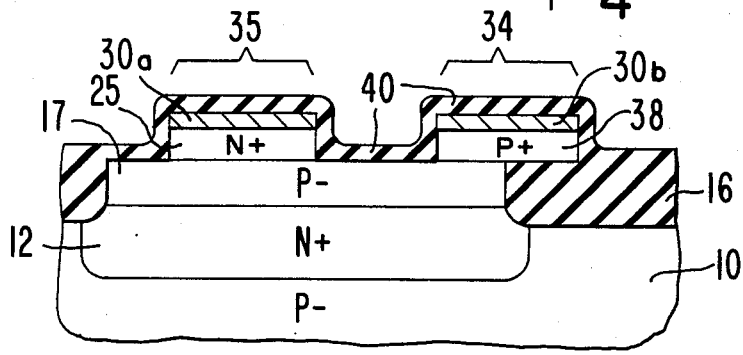
FIG. 4 is a cross-sectional view of the structure shown in FIG. 3.

After definition of strips 34 and 35 the structure is again heated to a temperature of about 800° C. for three hours in steam. In this manner, as shown in FIG. 4, a layer of silicon dioxide 40 will be formed across the surface of regions 17 and 18, elsewhere on epitaxial layer 15, and on the sides and top of strips 34 and 35. Because the heavily doped polycrystalline silicon regions 25, 28, 37, and 38 will oxidize faster than the lightly doped epitaxial material 17 and 18, a thicker layer of silicon dioxide 40 will form on the sides of strips 34 and 35 than on the surface of epitaxial material 17 and 18. Typically, the silicon dioxide 40 on the sides of strips 34 and 35 will be approximately 1500 Angstroms thick, while the silicon dioxide 40 on the surface of epitaxial silicon 17 and 18 will be approximately 500 Angstroms thick.

The integrated circuit structure shown in FIG. 4 is then anisotropically etched for example, using a plasma containing carbon tetrafluoride, to remove silicon dioxide layer 40 from the surface of epitaxial layer 15. In this manner the silicon dioxide 40 on the surface of the epitaxial layer is removed without removing all of the silicon dioxide from the top and sides of strips 34 and 35. The remaining silicon dioxide serves to electrically isolate strips 34 and 35 from subsequently formed overlying layers of polycrystalline silicon, for example layer 42, shown in FIG. 5.

Figure 5:
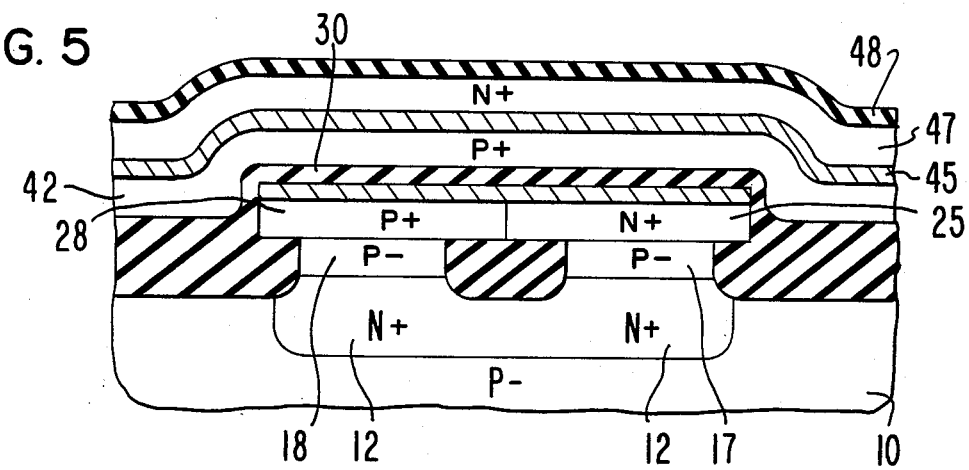
FIG. 5 is a subsequent cross-sectional view of the integrated circuit structure shown in FIG. 2 following deposition of two additional layers of semiconductor material and a layer of metal silicide.

Across the upper surface of the structure depicted in FIGS. 2, 3, and 4, layers of polycrystalline silicon 42 and 47, metal silicide 45, and silicon nitride 48 are deposited in the order shown in FIG. 5. In the preferred embodiment these layers are deposited sequentially during a single chemical vapor deposition process. Polycrystalline silicon layer 42 is doped with P conductivity type impurity, typically boron, while it is being deposited, and polycrystalline silicon layer 47 is doped with N conductivity type impurity, typically phosphorous, as it is being deposited. Layer 42 is approximately 3000 Angstroms thick and doped to an impurity concentration of $10^{19}$ atoms per cubic centimeter, while layer 47 is approximately 3000 Angstroms thick and doped to an impurity concentration of $10^{17}$ to $10^{19}$ atoms per cubic centimeter. Between these two layers is a layer of metal silicide 45, typically a refractory metal silicide, such as tantalum silicide or tungsten silicide approximately 1000 Angstroms thick. The upper layer of silicon nitride 48 is approximately 1000 Angstroms thick. In an alternate embodiment each of layers 42, 45, 47, and 48 is deposited sequentially using chemical vapor deposition processes, with layers 42 and 47 being doped with appropriate impurities using ion implantation.

Figure 9:
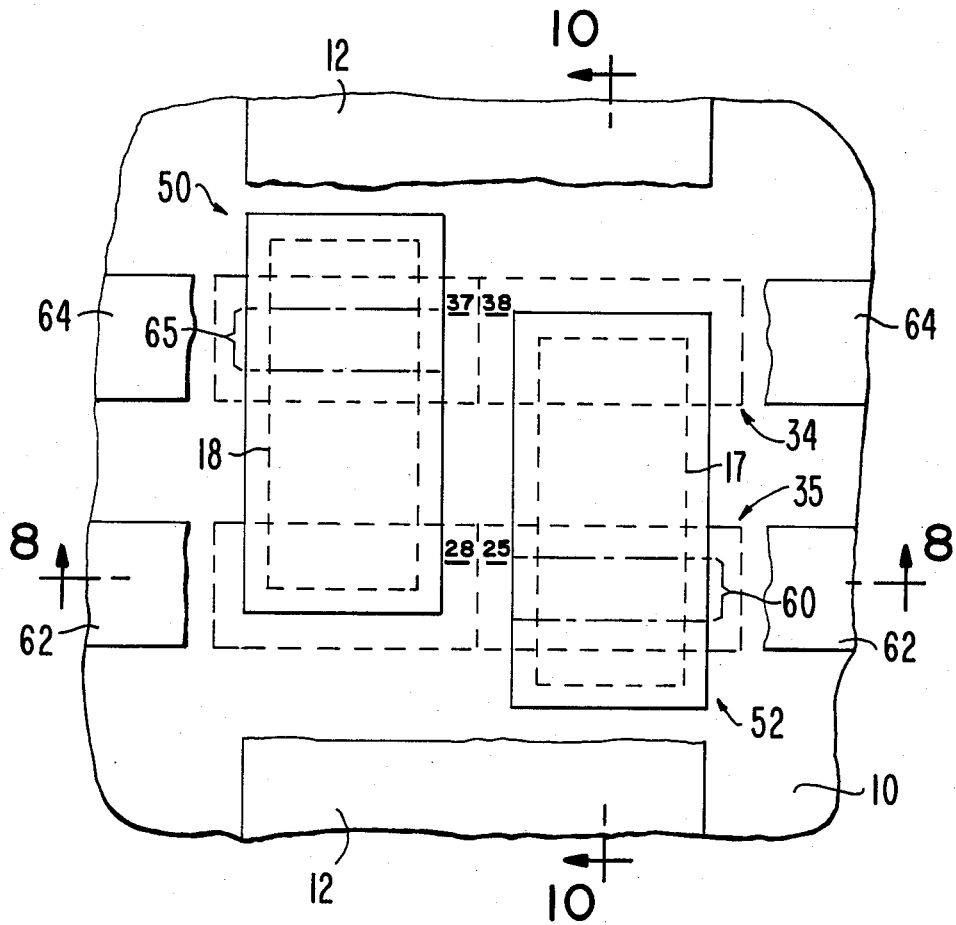
FIG. 9 is a top view of the structure shown in FIG. 8.
Figure 10:
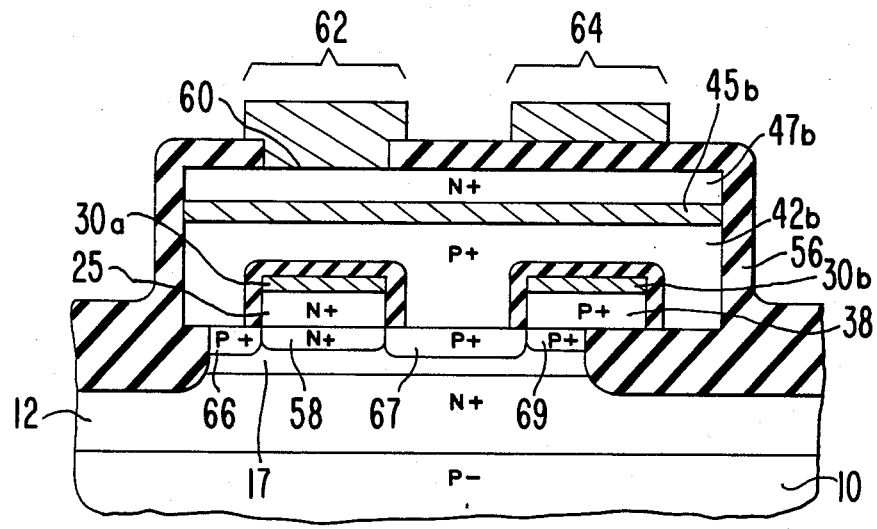
FIG. 10 is another cross-sectional view of the structure shown in FIG. 9.

As will be further explained in conjunction with FIGS. 9 and 10, the P+ polycrystalline silicon 42 provides a low resistance path between the base of each of the two transistors in the memory cell and the diode load devices associated with them. (One transistor is formed in the substrate beneath strip 34 and the other transistor is formed beneath strip 35). The layer of metal silicide 45 on the upper surface of polycrystalline silicon 42 provides an ohmic connection between the polycrystalline silicon layers 42 and 47. The N conductivity type polycrystalline silicon 47 provides an N type cathode for a Schottky diode because of the difficulty of making satisfactory Schottky diodes between P conductivity type polycrystalline silicon and an overlying metal layer. Silicon nitride 48 prevents oxidation of the underlying polycrystalline silicon layer 47 to enable fabrication of a Schottky diode by deposition of metal in contact with layer 47.

Figure 6:
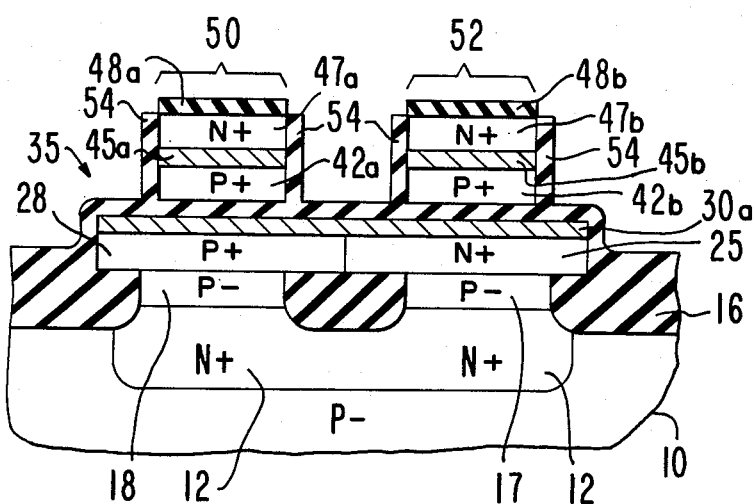
FIG. 6 is a subsequent cross-sectional view of the structure shown in FIG. 5 after definition of the deposited layers into two other strips.

Using well-known photolithographic and plasma or chemical etching techniques, the layers 42, 45, 47, and 48 are patterned into two strips 50 and 52 shown in end cross-sectional view in FIG. 6. Strips 50 and 52 are generally perpendicular to strips 34 and 35. In the preferred embodiment plasma etching with carbon tetrachloride or sulphur hexafluoride is used to etch the layers 42, 45, 47 and 48 and define strips 50 and 52. After the strips 50 and 52 are defined, the structure is oxidized by heating it to about 800° C. for two hours in a steam ambient. In this manner a relatively thin layer of silicon dioxide 54 about 1000 Angstroms thick is formed on the sides of the strips 50 and 52. No silicon dioxide 54 will form on the surfaces of the silicon nitride regions 48a and 48b which remain at the top of the strips 50 and 52.

Using well-known photolithographic techniques and a suitable mask, silicon nitride 48 is removed from the surface of the underlying N conductivity type polycrystalline silicon 47 everywhere except where Schottky diodes are to be formed. For example, a Schottky diode 65 is desired to be formed at the cross-sectional location in strip 52 depicted in FIG. 7, and accordingly silicon nitride region 48b is not removed from that location. At the same cross-sectional location in strip 50, no Schottky diode is desired, and accordingly silicon nitride region 48a is removed. (A Schottky diode is subsequently formed at a different cross-sectional location in strip 50.) In the preferred embodiment the silicon nitride is removed from the undesired locations by chemically etching the silicon nitride. This may be accomplished by dipping the masked integrated circuit structure in hot phosphoric acid. The thin layers of silicon dioxide 54 on the side walls of strips 50 and 52 prevents these portions of the strips from being etched.

Figure 7:
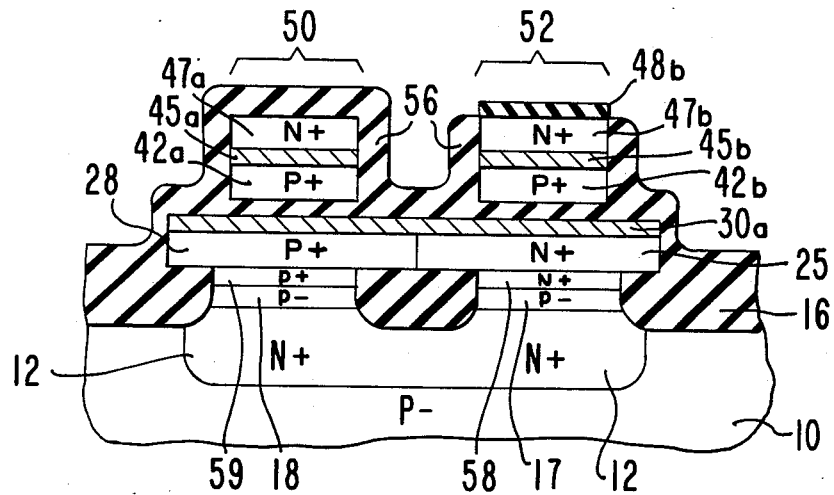
FIG. 7 is a subsequent cross-sectional view of the structure shown in FIG. 6 after removal of a region of silicon nitride, and oxidation of the structure.

The structure is next oxidized by heating it to approximately 1000° C. for one hour to create a relatively thick layer of silicon dioxide 56 over the underlying structure, including the surface of strips 50 and 52, except where protected by regions of silicon nitride layer 48. FIG. 7 shows the appearance of the structure after this oxidation process. During this relatively long high temperature process, N conductivity type dopant (phosphorous) in polycrystalline silicon 25 will diffuse into the underlying epitaxial semiconductor material 17 to create N conductivity type region 58. At the same time P conductivity type dopant (boron) present in polycrystalline silicon 28 will diffuse into the underlying structure to create a P conductivity type region 59. During this same process, and at other cross-sections shown in FIG. 10, P conductivity type impurities present in layer 42 will diffuse into the underlying epitaxial layer 15 to create additional P conductivity type regions, such as regions 66 and 67 shown in FIG. 10.

Figure 8:
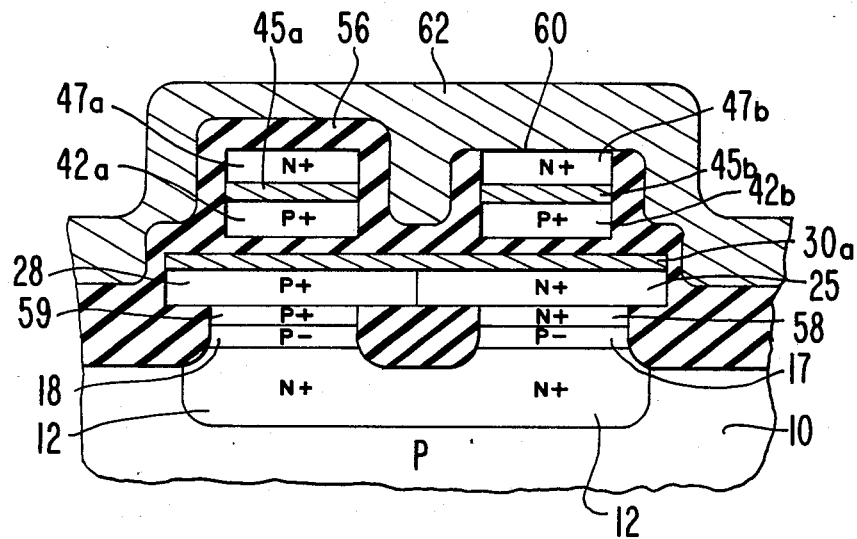
FIG. 8 is a subsequent cross-sectional view of the structure shown in FIG. 7 after deposition of a layer of metal to form a Schottky diode.

Following the formation of silicon dioxide 56, any remaining regions of silicon nitride, such as region 48b, are removed by dipping the structure in hot phosphoric acid. In this manner the surface of the N conductivity type polycrystalline silicon 47b is exposed in all locations where Schottky diodes are desired. A layer of metal 62, typically aluminum approximately 7000 Angstroms thick, is then sputtered onto the surface of the integrated circuit structure. The appearance of the structure after deposition of aluminum 62 is shown in FIG. 8. Aluminum 62 forms a Schottky diode 60 at the interface of aluminum 62 and N conductivity type polycrystalline silicon 47b. After deposition of the metal 62, conventional photolithographic and etching techniques are used to define metal 62 into two strips 62 and 64 generally overlying strips 34 and 35 as shown by FIG. 9. The metal strips 62 and 64 are the bit lines by which the memory cell structure is powered. If desired the entire structure may now be encapsulated in suitable protective material.

FIG. 9 illustrates the relationship of the various strips discussed in conjunction with FIGS. 1 through 8. As shown in FIG. 9 strips 62 and 64 of aluminum cross strips 50 and 52. Each of strips 50 and 52 comprises the sandwich structure discussed in conjunction with FIGS. 6 through 8, that is, P conductivity type polycrystalline silicon 42, metal silicide 54, and N conductivity type polycrystalline 47. In regions 60 and 65 where strips 62 and 64 cross strips 50 and 52, respectively, Schottky diodes are formed. Strips 50 and 52, in turn, overlie strips 34 and 35. Each of strips 34 and 35, as discussed above, includes a P conductivity type region 28 or 38 and N conductivity type region 25 or 37 shorted together by an overlying layer of metal silicide 30a or 30b.

Figure 11:
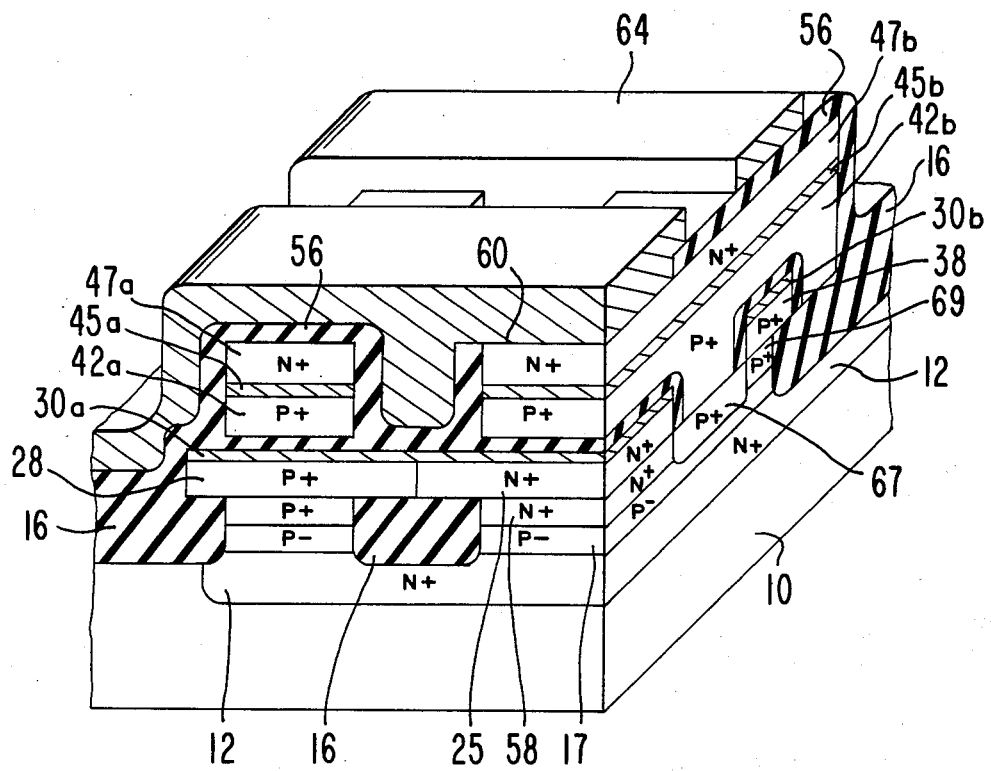
FIG. 11 is a perspective view of the completed structure.

FIG. 10 is a cross-sectional view of a portion of the structure shown in FIG. 9 taken at a right angle to the cross-section shown in FIG. 8. FIG. 10 illustrates the two aluminum strips 62 and 64, and the Schottky diode 60 formed by the interface of aluminum 62 and N conductivity type polycrystalline silicon 47b. Also illustrated is the P+ conductivity type polycrystalline silicon layer 42b which connects the epitaxial layer 17 through regions 66 and 67 to diode 60 via silicide 45b and N polycrystalline silicon 47b. The N and P conductivity type regions 58 and 69 and the P conductivity type regions 66 and 67 were formed by impurities diffusing from overlying doped polycrystalline silicon into the epitaxial material 17 during the relatively long thermal process which created the thick silicon dioxide layer 56. FIG. 11 is a perspective view of the structure shown in FIGS. 8, 9, and 10.

Figure 12:
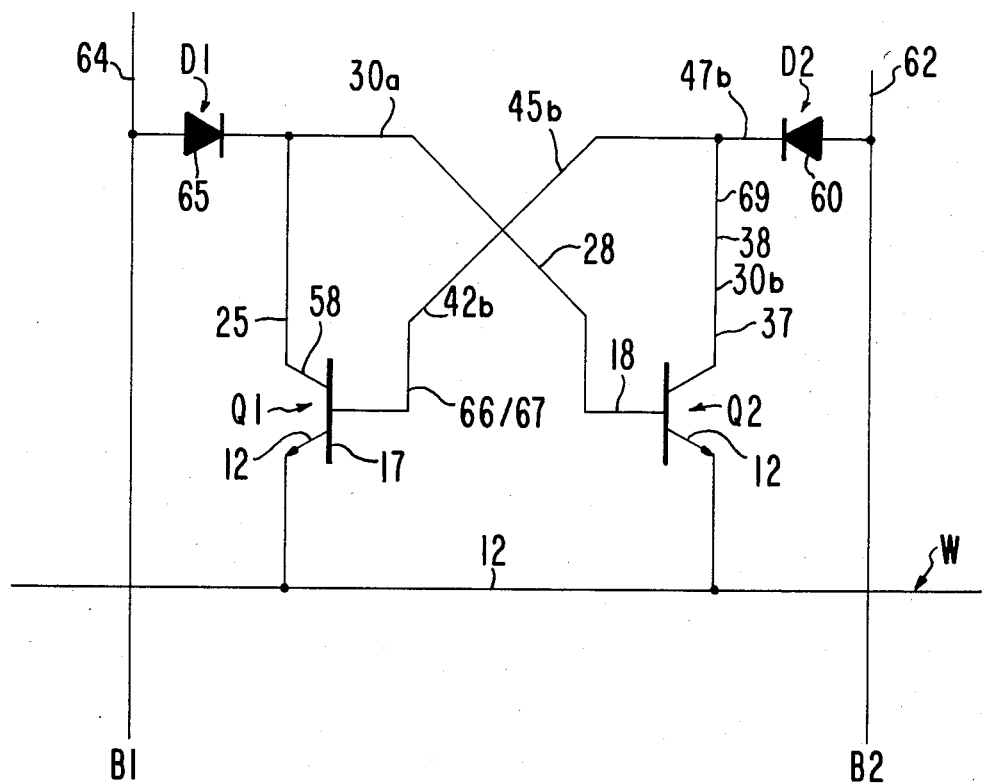
FIG. 12 is a circuit schematic of a discrete circuit equivalent to the integrated circuit depicted in FIGS. 8, 9, 10, and 11.

FIG. 12 is an electrical schematic of an equivalent discrete circuit to the integrated circuit created by the structure shown in FIGS. 8, 9, 10 and 11. As shown in FIG. 12 the circuit includes a pair of cross-coupled NPN transistors Q1 and Q2 having diode loads D1 and D2. Diode D1 is connected to bit line B1 while diode D2 is connected to bit line B2. The commonly coupled emitters 12 of transistors Q1 and Q2 are coupled to word line 12.

If the transistor formed utilizing epitaxial silicon 17 is termed transistor Q1, then the base of transistor Q1 is epitaxial region 17, the emitter is buried layer 12, and the collector is region 58. Collector 58 is coupled to the base 18 of the other transistor Q2 via N type region 25, metal silicide 30, P type region 28, and P type region 59. In a similar manner base 17 of transistor Q1 is connected via P conductivity type regions 66 and 67 to P type polycrystalline silicon 42b, then through silicide 45b to N conductivity type polycrystalline silicon 47b, to diode 60, and bit line 62. The collector (not shown) of transistor Q2 is coupled through N conductivity type polycrystalline silicon 37, silicide layer 30b, P conductivity type polycrystalline silicon 38, and P region 69 to base 17 of transistor Q1.

The integrated circuit structure and method of fabricating it provided by this invention result in an extremely small bipolar memory cell. Using two micron layout rules the cell occupies approximately 72 square microns. With one micron layout rules the cell occupies approximately 18 square microns and makes possible the fabrication of one million bit memories on a single integrated circuit chip. The self-aligned technique used to fabricate the Schottky diodes enables the width of the contact between the metal 62 and polycrystalline silicon 47 to be the full line width. When conventional prior art techniques are used to fabricate this contact, larger areas are required to prevent shorting of the metal on underlying polycrystalline silicon.

Although preferred embodiments of the method and apparatus of this invention have been described above, these embodiments are presented to illustrate the invention. It will be apparent to those skilled in the art that numerous variations may be made without departing from the scope of the invention as defined by the appended claims. For example, the conductivity types of the various regions may be reversed to create PNP transistors. In such event the Schottky diodes may be formed directly on layer 42 without the addition of silicide 45 and layer 47.

I claim:
1. An integrated circuit memory cell comprising:
   a semiconductor substrate;
   a first transistor and a second transistor formed in the substrate and each including a base, a collector, and an emitter;
   first and second connections of semiconductor material each extending between the base of one of the first and second transistors and the collector of the other of the first and second transistors, portions of the first and second connections being doped to correspond to the conductivity type of the base or the collector contacted;
   first and second layers of electrically conductive material deposited on the first and second connections, respectively;
   first and second regions of semiconductor material deposited on the substrate to contact the base of the first and second transistors, respectively; and
   third and fourth layers of electrically conductive material deposited on the first and second regions of semiconductor material, respectively;
   third and fourth regions of semiconductor material deposited on the third and fourth layers of electrically conductive material, respectively; and
   fifth and sixth regions of electrically conductive material deposited in contact with selected portions of the third and fourth regions of semiconductor material, respectively, form a first and a second Schottky diode connected to the bases of the first and second transistors respectively.

2. A structure as in claim 1 wherein the first and second connections comprise polycrystalline silicon.

3. A structure as in claim 2 wherein the first and second layers of electrically conductive material comprise a metal silicide.

4. A structure as in claim 3 wherein the first and second connections are each doped with both P and N conductivity type impurities.

5. A structure as in claim 1 wherein the first and second regions of semiconductor material comprise polycrystalline silicon.

6. A structure as in claim 5 wherein the third and fourth layers of electrically conductive material comprise a metal silicide.

7. A structure as in claim 6 wherein the third and fourth regions of semiconductor material comprise polycrystalline silicon.

8. A structure as in claim 7 wherein the first and second regions of semiconductor material are doped with P conductivity type impurity.

9. A structure as in claim 8 wherein the third and fourth regions of semiconductor material are doped with N conductivity impurity.

10. A structure as in claim 9 wherein the fifth and sixth regions of the electrically conductive material comprise metal.

11. A structure as in claim 10 wherein each of the first and second connections includes a PN junction.

12. A structure as in claim 11 wherein emitters of each of the first and second transistors comprise a buried layer in the semiconductor substrate.

13. A structure as in claim 12 wherein the buried layer is doped with N conductivity type impurity.

14. A structure as in claim 12 wherein the first and second transistors each comprise vertical bipolar transistors.

15. A structure as in claim 14 wherein each of the first and second connections connect to a base contact in the respective first and second transistors.

16. A structure as in claim 15 wherein each of the first and second transistors comprise NPN transistors.

17. A structure as in claim 16 wherein the emitters of the first and second transistors are coupled together by the buried layer.

* * * * *